(12) United States Patent
Bucksch et al.

(10) Patent No.: US 7,061,227 B2
(45) Date of Patent: Jun. 13, 2006

(54) APPARATUS AND METHOD FOR CALIBRATING A SEMICONDUCTOR TEST SYSTEM

(75) Inventors: Thorsten Bucksch, München (DE); Arti Prasad Roth, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/878,681

(22) Filed: Jun. 29, 2004

(65) Prior Publication Data

US 2005/0024059 A1 Feb. 3, 2005

(30) Foreign Application Priority Data

Jun. 30, 2003 (DE) ................................ 103 30 043

(51) Int. Cl.
*G01R 31/02* (2006.01)
(52) U.S. Cl. .................................. 324/158.1; 324/754
(58) Field of Classification Search ..................... None
See application file for complete search history.

(56) References Cited

U.S. PATENT DOCUMENTS

| | | | | |
|---|---|---|---|---|
| RE31,056 E | * | 10/1982 | Chau et al. ................. | 714/700 |
| 4,929,888 A | * | 5/1990 | Yoshida ....................... | 714/736 |
| 5,929,628 A | * | 7/1999 | Becker et al. ............ | 324/158.1 |
| 6,327,678 B1 | * | 12/2001 | Nagai .......................... | 714/700 |
| 6,586,924 B1 | * | 7/2003 | Okayasu et al. ......... | 324/158.1 |
| 6,622,103 B1 | * | 9/2003 | Miller ......................... | 702/89 |
| 6,847,212 B1 | * | 1/2005 | Muhitch et al. ............ | 324/601 |
| 6,856,154 B1 | * | 2/2005 | Song et al. .................. | 324/754 |
| 6,897,646 B1 | * | 5/2005 | Grebner et al. .......... | 324/158.1 |
| 6,911,814 B1 | * | 6/2005 | Miller et al. ............. | 324/158.1 |
| 2005/0046436 A1 | * | 3/2005 | Frankowsky et al. ....... | 324/765 |

FOREIGN PATENT DOCUMENTS

DE 197 55 659 6/1999

* cited by examiner

*Primary Examiner*—Paresh Patel
(74) *Attorney, Agent, or Firm*—Morrison & Foerster LLP

(57) ABSTRACT

A process and device for calibrating a semiconductor component test system includes a first connection, at which a corresponding signal, in particular a calibration signal can be input, and a second and third connection, at which the signal, in particular a calibration signal, can be emitted. The first connection is and/or can be connected via a corresponding line to a first switching apparatus, which is and/or can be connected to the second connection. A second switching apparatus is and/or can be connected to the third connection. Advantageously, the signal is then transferred to the second connection, and barred from the third connection by the first switching apparatus being closed and the second switching apparatus being opened.

10 Claims, 2 Drawing Sheets

APPARATUS AND METHOD FOR CALIBRATING A SEMICONDUCTOR TEST SYSTEM

CLAIM FOR PRIORITY

This application claims priority to German Application No. 103 30 043.0 filed Jun. 30, 2003, which is incorporated herein, in its entirety, by reference.

TECHNICAL FIELD OF THE INVENTION

The invention relates to a process for calibrating a semiconductor component test system, as well as an apparatus for calibrating a semiconductor component test system.

Semiconductor components, for instance corresponding integrated (analog and/or digital) computing circuits, semiconductor memory components, for instance functional memory components (PLAs, PALs, etc.) and table memory components (e.g. ROMs or RAMs, in particular SRAMs and DRAMs) are, for instance in a semi-completed and/or in completed state, subjected to extensive testing at numerous test stations.

For testing the semiconductor components, an appropriate semiconductor component test apparatus can be provided at each test station, which generates the test signals required for testing the semiconductor components.

For instance, at a first test station, the signals required for testing semiconductor components still on the corresponding wafer can be generated by a test apparatus connected to a corresponding semiconductor component test card ("probecard"), and fed to the pads of the semiconductor components by pin-shaped connections ("contact pins") provided on the test card.

The signals emitted by the semiconductor components in reaction to test signals input at corresponding pads are scanned by corresponding pin-shaped connections ("contact pins") and transferred (for instance via a corresponding signal line that connects the probecard to the test apparatus) to the test apparatus, where the corresponding signal can be evaluated.

After slicing up the wafer, the components, now individually available, can each be loaded into so-called carriers (i.e. a corresponding container) and transported to a further test station.

At the further test station, the carriers are inserted into corresponding adapters and/or sockets, connected to a (further) test apparatus, and the component present in each carrier is subjected to corresponding (further) test procedures.

For testing the semiconductor components present in the carrier, the corresponding test signal emitted by the test apparatus is transferred via the adapter and the carrier (and/or corresponding connections of the carriers) to the corresponding pads of the respective semiconductor component.

The signals emitted by the semiconductor components at corresponding pads in reaction to the input test signal are scanned by corresponding carrier connections and transferred to the test apparatus via the adapter (and a signal line connecting the adapter to the test apparatus) where the corresponding signal can be evaluated.

In correspondingly similar fashion the semiconductor components can, for instance, also be tested after their final assembly in corresponding component housings (for instance, corresponding plug-in or surface mounted housings) and/or after these housings, provided with corresponding semiconductor components, have been mounted in corresponding electronic modules, etc.

In order to achieve a high degree of accuracy in the above test procedures (in particular a high degree of accuracy in the signals used and/or measured in the above test procedures) each test apparatus can, before the start of the actual test procedures, be subjected to a calibration and/or set-up process.

For instance, the test apparatus in question can emit a corresponding calibration signal to a signal line connecting the corresponding test apparatus to the probecard in question, the adapter (for instance the carrier or housing adapter) and the reflexive signal caused by the calibration signal can be measured and evaluated by the test apparatus. This process is relatively inaccurate.

Alternatively so-called point-to-point calibration and/or point-to-point set-up processes can be used. Through this process, the calibration signal emitted by the test apparatus at the above signal line is measured and evaluated (for instance by a corresponding calibration apparatus) at and/or near to where it would be received by each component during the subsequent actual test.

In this way, it can be ensured that the signal received by each component from the test apparatus, during the subsequent actual test, corresponds most closely to the test signal required for the test in question (with most exactly the voltage levels required, and/or with most exactly the signal timing required , etc.).

The testing of semiconductor components still present on a corresponding wafer by way of the above probecards (and correspondingly also the calibration of test apparatuses used in each case) can take place in a sub-system isolated from the environment (for instance, in a corresponding micro clean-room system).

In order to perform the above calibration and/or set-up process, the test apparatus in question is connected, via a corresponding signal line, to a corresponding apparatus (moveable within the sub-system), having (for instance, three) pin-shaped connections and/or contact pins (for instance, to an SPP or short pin plate).

For calibrating the test apparatus, the SPP (short pin plate) is moved to a calibration apparatus (for instance, an NAC or needle auto calibration apparatus), in particular to its NAC plate (needle auto calibration plate), so that the desired connections and/or contact pins of the SPP contact the desired connections (pads) of the calibration apparatus (NAC)(and/or the desired connections of its contact plate (needle auto calibration plate). A calibration signal emitted by the test apparatus, via the above signal line, can then be measured by the calibration apparatus and evaluated.

In correspondingly inverted fashion, for instance, a (further) calibration signal also emitted by the calibration apparatus can be transferred (via a corresponding NAC pad, and a corresponding SPP contact pin) to the test apparatus and measured and evaluated there.

After calibrating the test apparatus, the SPP can then again be removed from the NAC apparatus, in particular from the NAC plate, wherein, for instance, a corresponding probecard calibration and/or set-up process can then be performed.

For this, the probecard can (correspondingly similar to the SPP previously) be moved to the above calibration apparatus (NAC apparatus, in particular its NAC plate (needle auto calibration plate)) so that the connections and/or contact pins of the probecard, as desired in each case, contact the desired connections (pads) of the calibration apparatus.

A corresponding calibration signal, emitted by the calibration apparatus (NAC apparatus) is then transferred, via a corresponding NAC pad, and a corresponding probecard contact pin making contact therewith, to the probecard.

The signal emitted in reaction to the input of the calibration signal from the probecard to a corresponding contact pin is scanned by a corresponding NAC pad, connected to the contact pin, and then measured and evaluated by the calibration apparatus.

A disadvantage of the above procedure is inter alia that the calibration-signals for calibrating the test apparatus need to be transferred via additional pins (namely the above SPP contact pins), which can lead to inaccuracies.

A further disadvantage is that, as described above, the SPP and the probecard need to be moved in relation to the calibration apparatus (NAC), and also need to be so accurately set up in each case that corresponding SPP or probecard contact pins in each case make contact with corresponding NAC pads. This can lead, in particular with a faulty placing of the contact pins, to distortions.

SUMMARY OF THE INVENTION

The invention directed to making available an apparatus and method for calibrating a semiconductor component test system.

According to an aspect of the invention, an apparatus for calibrating a semiconductor component test system is made available, which includes a first connection, at which a corresponding signal, in particular a calibration signal, can be input, and a second and third connection, at which the signal, in particular a calibration signal can be emitted. The first connection is connected or connectable via a corresponding line to a first switching apparatus, which is connected and/or connectable to the second connection, and to a second switching apparatus, which is connected and/or connectable to the third connection.

Advantageously, a test apparatus to be calibrated can, for instance, be connected to the second connection, and, for instance, a semiconductor component test card (probecard) to the third connection.

Preferably, depending on the process, in particular the calibration process to be performed in each case, either the first switching apparatus is closed, and the second switching apparatus opened, so that the signal is transferred to the second connection (in particular to the test apparatus), and not to the third connection (in particular not to the probecard), or that the first switching apparatus is opened, and the second switching apparatus closed, so that the signal is transferred to the third connection (in particular to the probecard), and not to the second connection (in particular not to the test apparatus).

Thereby, and without having to move the probecard (and/or any further apparatuses of the semiconductor component test system), for instance, first the test apparatus, and then the probecard (or the other way round) can be subjected to a corresponding test and/or calibration process by one and the same calibration apparatus (for instance, the one connected to the above first connection).

DETAILED DESCRIPTION OF THE INVENTION

Figure 1:
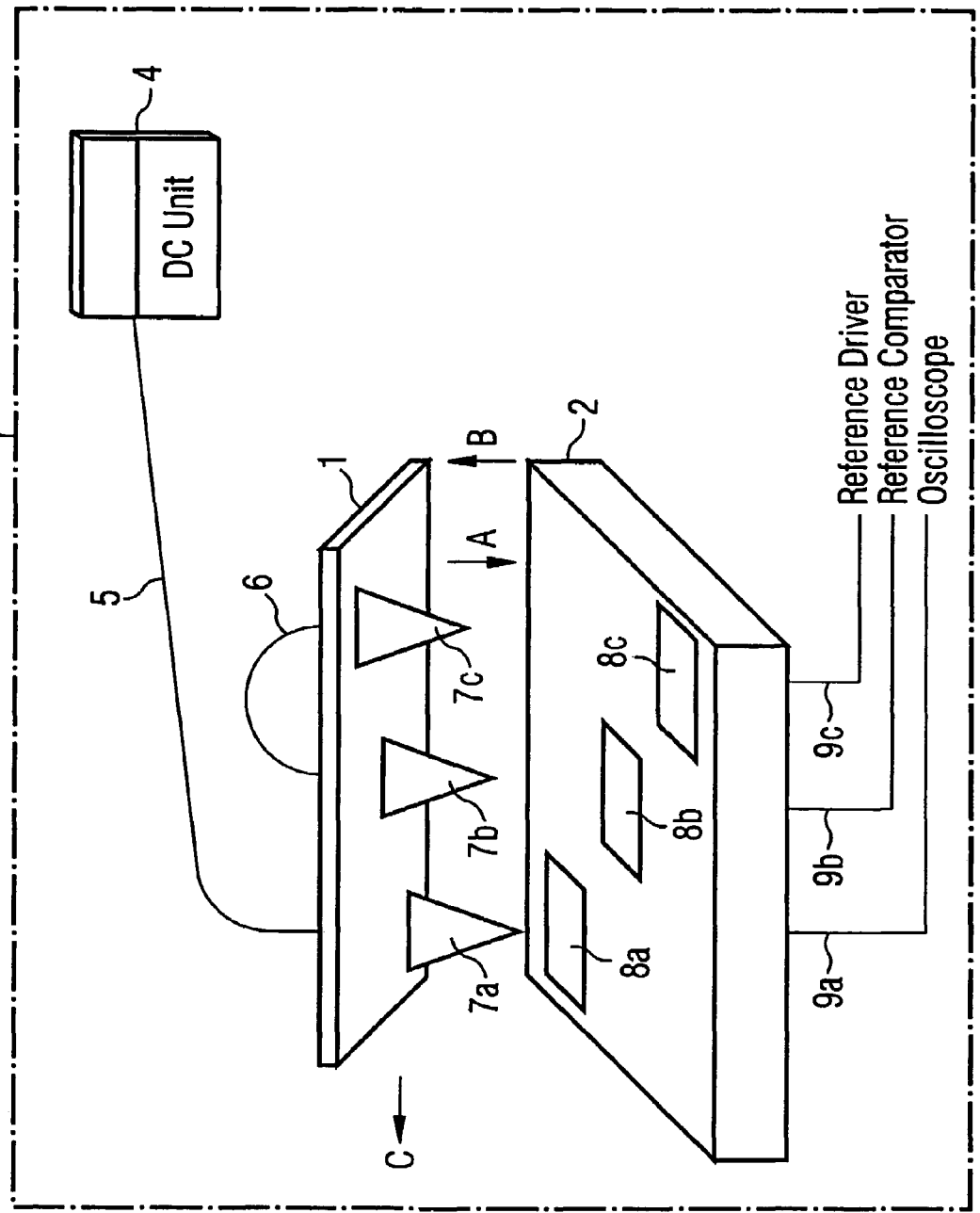
FIG. 1 shows a schematic representation of the main construction elements of prior art apparatuses.

FIG. 1 shows a schematic representation of the main construction elements of prior art apparatuses 1, 2 (here: of an SPP (short pin plate) apparatus 1 used for calibrating a semiconductor component test system) as well as an NAC (needle auto calibration) apparatus 2, or more accurately, its contact plate 2 (needle auto calibration plate 2).

The semiconductor component test system has a test apparatus 4 (a DC test apparatus) 4, which serves to test several semiconductor components, produced on a silicon disk and/or wafer at a test station 3.

These semiconductor components, can, for instance, be corresponding integrated (analog and/or digital) computing circuits, semiconductor memory components, for instance, functional memory components (PLAs, PALs, etc.) and table memory components (e.g. ROMs or RAMs), in particular SRAMs and DRAMs (here instance DRAMs (Dynamic Random Access Memories and/or dynamic read-write memories) with double data rate (DDR-DRAMs=Double Data Rate DRAMs)).

The test signals required for testing the semiconductor components, still present on the silicon disk and/or wafer, are transferred via one or more signal lines from test apparatus 4, to a semiconductor component test card and/or probecard (not shown here) and, via corresponding contact pins provided on the probecard, to corresponding connections and/or pads provided on the semiconductor components.

The signals emitted in reaction to the input test signals at corresponding (for instance the above or differing) semiconductor component connections and/or pads are—correspondingly inverted as described above—scanned by the corresponding contact pins of the probecard, and transferred via the above or several further signal lines to the test apparatus 4, where the corresponding signals can then be evaluated.

As is apparent from FIG. 1, the above probecard, the semiconductor components (and/or the wafer) to be tested, the SPP-apparatus 1, and the NAC apparatus 2 and/or the NAC contact plate 2, (as well as possibly also the above test apparatus 4, and the signal output and signal evaluation apparatuses, not shown here, the above NAC apparatus 2 (see below)) have been arranged in the test station 3 in a sub-system (for instance a corresponding micro clean-room system isolated from the environment).

According to FIG. 1, the test apparatus 4 for calibrating the test apparatus 4 (and/or for performing, before the actual test procedure is performed, a corresponding test apparatus set-up procedure) is and/or can be connected via a corresponding signal line 5 (for instance the above signal line, or a further signal line) to the above SPP apparatus 1.

This has, for instance on its underside, several, for instance, three, pin-shaped connections and/or contact pins 7a, 7b, 7c.

The first contact pin 7a is connected to the above signal line 5 (and thereby also to the test apparatus 4); the second and third contact pins 7b, 7c are short-circuited via a line 6.

Several, for instance three connections (pads) 8a, 8b, 8c have been provided on the NAC apparatus 2, and/or, more correctly, its contact plate 2 (needle auto calibration plate 2), for instance, to its upper side.

As is apparent from FIG. 1, the NAC pad 8b has been connected to a line 9b (and via it to the signal evaluation apparatus of the above NAC-apparatus 2, not shown here).

Furthermore the NAC pad 8c is connected to a line 9c (and via it to the, also not shown here, signal output apparatus of the above NAC apparatus 2), and the NAC pad 8a to a line 9a (and via this to an oscilloscope).

The SPP apparatus 1 has been so arranged that that it can be moved within the micro clean-room system, for instance, in a vertical and/or horizontal direction (for instance in the direction of the arrows A, B, C, etc. shown in FIG. 1).

In order to perform the above test apparatus calibration and/or set-up process, the SPP apparatus 1 is moved downwards from a corresponding position above the NAC apparatus 2 (cf. Arrow A), until the SPP contact pins 7a, 7b, 7c, as required in each case, make contact with the connections 8a, 8b, 8c (pads) of the NAC apparatus 2, as required in each case, (for instance the SPP contact pin 7a contacts the pad 8b (or any other pads, for instance pad 8c, etc., etc.)).

This can lead to a calibration signal (reference signal) emitted by the test apparatus 4 via the above signal line 5, for instance, via the contact pin 7a (and, for instance, the NAC pad 8b, and the line 9b), being transferred to the signal evaluation apparatus of the above NAC apparatus, where it can be measured and evaluated (or for instance, in correspondingly inverted fashion, to a calibration signal (reference signal) emitted by the signal output apparatus of the above NAC apparatus via the line 9c being (further) transferred, for instance via the NAC pad 8c (and for instance the contact pin 7a, and the signal line 5) to the test apparatus 4 where it can be measured and evaluated).

After calibrating the test apparatus 4, the SPP apparatus 1 can again be moved away from the NAC apparatus 2 (for instance first in a vertical direction upwards (Arrow B), and then, for instance, in a horizontal direction to the left (Arrow C)).

Next, the above probecard can also, similarly to the test apparatus 4, be subjected to a corresponding calibration and/or set-up-procedure (and/or test procedure).

For this, the probecard can, for instance, first be moved into a position above the NAC apparatus 2, and then, for instance, downwards in the direction of the arrow A.

In this way, the probecard contact pins, required in each case, can make contact with the connections 8a, 8b, 8c (pads) of the NAC apparatus 2, as required in each case.

A corresponding calibration and/or test signal emitted by the NAC apparatus is then transferred to the probecard, via a corresponding NAC pad (for instance the pad 8c), and a corresponding probecard contact pin in contact therewith.

The signal emitted in reaction to the input calibration signal by the probecard at a corresponding contact pin is then scanned by a corresponding pad of the NAC apparatus 2 (for instance by the pad 8b), which is connected to the contact pin, so that the corresponding signal can then be measured and evaluated in the NAC apparatus 2.

Figure 2:
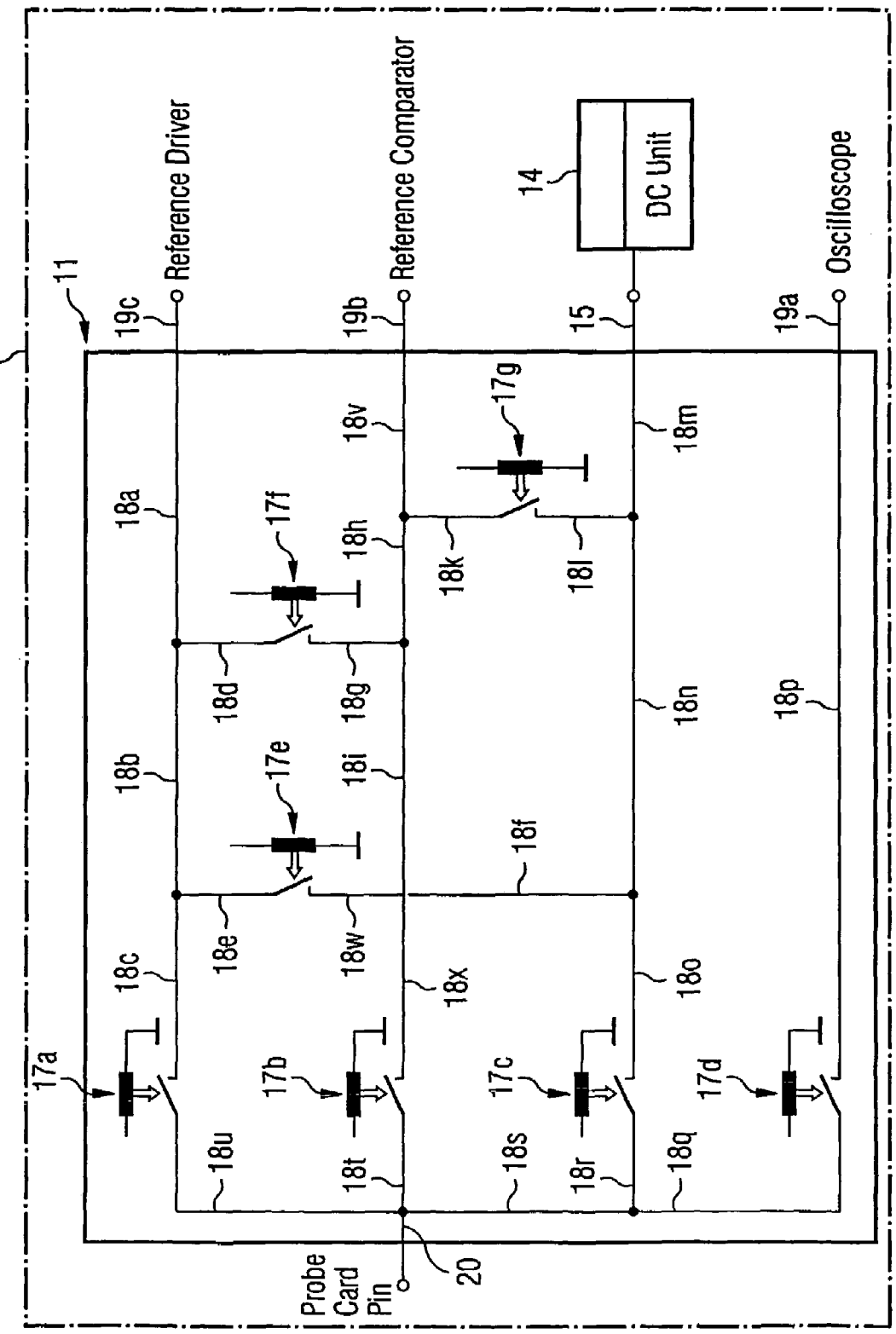
FIG. 2 shows a schematic representation of the main construction elements of an apparatus according to an embodiment of the invention.

FIG. 2 shows a schematic representation of the main construction elements of an apparatus 11 (a switching apparatus described in more detail below) according to an embodiment of the invention, for calibrating and/or testing a semiconductor component test system, and a test apparatus 14.

With the test apparatus 14 shown in FIG. 2, the switching apparatus 11, as well as a probecard (not shown here) and a calibration apparatus (also not shown here), the same semiconductor component test procedures and/or test apparatus calibration and/or set-up-procedure and/or probecard-calibration and/or set-up-procedure (and/or test procedures) can in principle, as is more closely described below, be performed as with the system as set out in connection with FIG. 1.

As is apparent from FIG. 2, the test apparatus 14 is connected to the switching apparatus 11 via a signal line 15 corresponding with the signal line 5 shown in FIG. 1.

The switching apparatus 11 has a multitude of switches, for instance a multitude of relays 17a, 17b, 17c, 17d, 17e, 17f, 17g, mounted and/or arranged in matrix-like fashion on a corresponding circuit board.

According to FIG. 2, the signal line 15, connected to test apparatus 14, is connected via a line 18m to a corresponding connection of the switching apparatus 11, and via it to a line 18l, which is connected to the first connection of the relay 17g and to a line 18n, connected to line 18o and a line 18f.

A signal output apparatus of the above calibration apparatus (not shown) is connected via a line 19c, corresponding with the line 9c shown in FIG. 1, to a corresponding, further, connection of the switching apparatus 11, which is connected via a line 18a, and via a line 18d connected to it, to a first connection of the relay 17f.

In corresponding fashion, a signal evaluation apparatus of the calibration apparatus (not shown) is connected via a line 19b, corresponding with the line 9b shown in FIG. 1, to a corresponding, third, connection of the switching apparatus 11, which is connected via a line 18v, and via a line 18k connected thereto, to a second connection of the relay 17g.

As is apparent from FIG. 2, an oscilloscope (not shown) is connected via a line 19a, corresponding with the line 9a shown in FIG. 1, to a corresponding fourth connection of the switching apparatus 11, which is in turn connected via a line 18p to a first connection of the relay 17d.

A second connection of the relay 17d is connected via a line 18q to a line 18s, and to a line 18r, connected to a first connection of the relay 17c.

The above line 18o, connected to the lines 18f and 18n, is connected to a second connection of the relay 17c.

According to FIG. 2, the above interconnected lines 18v and 18k are connected to a line 18h, which is connected to a line 18i, and to a line 18g, connected to a second connection of the above relay 17f.

Furthermore, the above interconnected, lines 18a and 18d are connected to a line 18b, which is connected to a line 18c, and to a line 18e connected to a first connection of the relay 17e.

The above line 18i is connected to a line 18x, which is connected to a first connection of the relay 17b.

Furthermore, the above line 18f is connected to a line 18w, which is connected to a second connection of the relay 17e.

As is further apparent from FIG. 2, the above line 18c, connected to the lines 18b and 18e, is connected to a first connection of the relay 17a, of which the second connection is connected to a line 18u.

The interconnected lines 18q and 18r are connected to the above line 18s, which is connected to the above line 18u, as well as to a line 20, connected a corresponding connection of the switching apparatus 11, and to a line 18t connected to a second connection of the relay 17b.

The test apparatus 14 shown in FIG. 2 can correspond in its function and construction to the test apparatus 4 shown in FIG. 1 (and also the probecard, not shown in FIG. 2, to the probecard explained in connection with FIG. 1, the corresponding signal evaluation and signal output apparatus connected to the lines 19c and/or 19b to the corresponding (NAC) signal evaluation and output apparatus, explained in connection with FIG. 1, and the oscilloscope connected to line 19a to the corresponding oscilloscope, explained in relation to FIG. 1).

As is apparent from FIG. 2, the above probecard (as well as the semiconductor components, arranged on a wafer, to be tested by means thereof), the switching apparatus 11 (as well as possibly also the above test apparatus 14, and the signal output and evaluation apparatuses of the above calibration apparatus not shown here) have been arranged in the test station 13, corresponding to the test station 3 shown in FIG. 1, in a sub-system (for instance a corresponding micro clean-room system), isolated from the environment. The switching apparatus 11 can, for instance, be attached to the probecard, or to any other apparatus of the test station 13, in particular of the micro clean-room system (i.e. fixed, in relation to the probecard, the test apparatus 14, and/or the calibration apparatus in the micro clean-room system).

The above relays 17a, 17b, 17c, 17d, 17e, 17f, 17g can be correspondingly opened and/or closed with the help of a control installation, connected to the switching apparatus 11 (not shown) and sending out corresponding relay switching control signals so that without the probecard, and/or corresponding further apparatuses (for instance, as explained in connection with FIG. 1, corresponding with an SPP apparatus) having to be moved correspondingly within the test station 13, in particular inside the micro clean-room system, the above semiconductor component test procedures and/or test apparatus calibration and/or set-up procedures and/or probecard calibration and/or test procedures can be performed.

For instance, in order to perform a test apparatus calibration and/or set-up-procedure corresponding to the calibration and/or set-up-procedure described above in relation to FIG. 1, the above relays 17g can be closed (and the remaining relays 17a, 17b, 17c, 17d, 17e, 17f opened).

In this way, a calibration signal (reference signal) emitted by the test apparatus 14 via the above signal line 15 can be transferred via the above lines 18m, 18l, the, closed, relay 17g, the line 18k, the line 18v, and the line 19b connected thereto, to the signal evaluation apparatus of the above calibration apparatus, where it can be measured and evaluated.

In this way, it can be ensured that the signals received by each semiconductor component, at the later, actual test, from the test apparatus 14, simulated by the above calibration signal, correspond to the test signals required for each test (with most exactly the voltage levels required, and/or with most exactly the signal timing required, etc.).

Furthermore, it can be achieved by the corresponding closing of for instance the relays 17a and 17c (and opening of the remaining relays 17b, 17d, 17e, 17f, 17g), that, correspondingly inverted, a (further) calibration signal (reference signal) emitted by the signal output apparatus of the above calibration apparatus via the line 19c, can, for instance, be transferred via the above lines 18a, 18b, 18c, the closed relays 17a, the lines 18u, 18s, 18r, the closed relays 17c, and the lines 18o, 18n, 18m, and the line 15 connected thereto, to the test apparatus 14 where it can be measured and evaluated.

Next, for instance, the probecard can be subjected to a corresponding calibration/set-up and/or test-procedure, without this and/or any other installations having to be moved.

As is apparent from FIG. 2, the above line 20 (and/or the connection of the switching apparatus 11 connected to it) is connected, for instance via a corresponding line (not shown here), to a corresponding probecard connection (and/or to a contact pin and/or pin of the probecard connected thereto)(as well as further connections of the switching apparatus 11 being, correspondingly similar to the connection of the switching apparatus 11 connected to line 20, connected with said relays and/or further relays (via corresponding lines) to corresponding further probecard connections (and/or corresponding probecard-contact pins and/or pins connected thereto).

In order to perform a probecard calibration/set-up and/or test procedure, corresponding to the probecard calibration/set-up and/or test procedure described above in relation to FIG. 1, the above relay 17a can for instance then be closed (and the remaining relays 17b, 17c, 17d, 17e, 17f, 17g opened).

This serves to achieve that a calibration signal (reference signal) emitted by the above output apparatus of the calibration apparatus to the above line 19c, can then be transferred via the above lines 18a, 18b, 18c, the closed relay 17a, the line 18u and line 20 connected thereto, to the probecard (in particular to the above probecard connection and/or the above probecard contact pin).

The signal emitted in reaction to the input calibration signal from the probecard to a corresponding contact pin and/or to a corresponding probecard connection is then, in corresponding fashion as described for the above calibration signal, transferred via a corresponding line, connected to a corresponding connection of the switching apparatus 11 (and the above, and/or further relays) and for instance the line 19b, to the evaluation apparatus of the calibration apparatus, where the corresponding signal can then be measured and evaluated, etc.

After performing the above calibration/set-up and/or test procedure the actual semiconductor component test procedures can then be performed with the help of the test apparatus 14 (here: a DC test apparatus 14).

The semiconductor components to be tested may, for instance, be, corresponding to those described in relation to FIG. 1 above, corresponding integrated (analog and/or digital) computing circuits, and/or semiconductor memory components, for instance functional memory components (i.e. PLAs, PALs, etc.), and table memory components, (for instance ROMs or RAMs), in particular SRAMs or DRAMs (here for instance DRAMs (Dynamic Random Access Memories and/or Dynamic Read-Write Memories) with double data rate (DDR DRAMs=Double Data Rate-DRAMs).

In order to perform a semiconductor component test procedure corresponding to the semiconductor component test procedures described above in relation to FIG. 1, the above relay 17c can, for instance be closed (and the remaining relays 17a, 17b, 17d, 17e, 17f, 17g be opened).

This serves to achieve that a test signal emitted by the test apparatus 14 to the above signal line 15, can be transferred via the above lines 18m, 18n, 18o, the closed relay 17c, the lines 18r, 18s, and line 20 connected thereto, to the probecard, and from there to the corresponding probecard contact pin.

Via the contact pin, the test signal is then transferred to a corresponding pad and/or a corresponding connection of the corresponding semiconductor component, still present on the silicon disk and/or the wafer, to be tested.

The signal emitted in reaction to the input test signal to a corresponding semiconductor component connection and/or pad is then correspondingly inverted, as described above, scanned by a corresponding contact pin of the probecard, and transferred via a corresponding line connected to a corresponding connection of the switching apparatus 11 (and the above and/or further relays), and a further signal line (not shown here) to the test apparatus 14, where an evaluation of the corresponding signal can then take place.

REFERENCE NUMBERS

1 SSP
2 NAC
3 Test station
4 Test apparatus
5 Signal line
6 Line
7a Contact pins
7b Contact pins
7c Contact pins
8a Pad
8b Pad
8c Pad
9a Line
9a Line
9c Line
11 Switching apparatus
12 Test station
14 Test apparatus
15 Signal line
17a Relay
17b Relay
17c Relay
17d Relay
17e Relay
17f Relay
17g Relay
18a Line
18b Line
18c Line
18d Line
18e Line
18f Line
18g Line
18h Line
18i Line
18k Line
18l Line
18m Line
18n Line
18o Line
18p Line
18q Line
18r Line
18s Line
18t Line
18u Line
18v Line
18w Line
18x Line
19a Line
19b Line
19c Line
20 Line

What is claimed:

1. A system, comprising:
an apparatus, comprising:
a first connection, at which a corresponding calibration signal can be input;
a second connection at which the calibration signal can be emitted, to which a semiconductor component test apparatus is connectable;
a third connection at which the calibration signal can be emitted, to which a probecard is connectable for contacting semiconductor components to be tested by the semiconductor component test apparatus, wherein
the first connection being at least one of connected and connectable via a corresponding line to a first switch, which is at least one of connected and connectable to the second connection, and to a second switch, which is at least one of connected and connectable to the third connection; and
a calibration apparatus connected to the first connection for selectively calibrating at least one of the semiconductor component test apparatus and the probecard depending on a state of the first and the second switch.

2. An apparatus according to claim 1, wherein, dependent upon a particular calibration procedure to be performed respectively, either the first switch is closed, and the second switch is opened so that the calibration signal is transferred to the second connection rather than the third connection or the first switch is opened and the second switch is closed so that the calibration signal is transferred to the third connection and not to the second connection.

3. An apparatus according to claim 1, wherein the switching apparatuses are relays.

4. An apparatus according to claim 1, wherein the switching apparatuses are transistors.

5. A system comprising:
a first connection, at which a corresponding calibration signal can be input;
a second connection at which the calibration signal can be emitted;
a third connection at which the calibration signal can be emitted, wherein the first connection which is at least one of connected and connectable via a corresponding line to a first switching apparatus, which is at least one of connected and connectable to the second connection, and to a second switching apparatus, which is at least one of connected and connectable to the third connection;
a calibration apparatus connected to the first connection for calibrating a semiconductor component test apparatus; and
at least one of a semiconductor component test card and a probecard connected to the third connection for contacting the semiconductor components to be tested by the semiconductor component test apparatus.

6. A system according to claim 5, wherein the semiconductor component test apparatus is connected to the second connection.

7. A method for calibrating a semiconductor component test system by using an apparatus, comprising:
inputting a calibration signal at a first connection of the apparatus;
emitting the calibration signal at a second connection of the apparatus, to which the semiconductor component test apparatus is connectable;
emitting the calibration signal at a third connection, to which a probecard is connectable for contacting semiconductor components to be tested by the semiconductor component test apparatus, wherein
the first connection being at least one of connected and connectable via a corresponding line to a first switch, which is at least one of connected and connectable to the second connection, and to a second switch, which is at least one of connected and connectable to the third connection; and
selectively calibrating, using a calibration apparatus connected to the first connection, at least one of the semiconductor component test apparatus and the probecard depending on a state of the first and the second switch.

8. The method according to claim 7, wherein, dependent upon a particular calibration procedure to be performed respectively, either the first switch is closed, and the second switch is opened so that the calibration signal is transferred to the second connection rather than the third connection or the first switch is opened and the second switch is closed so that the calibration signal is transferred to the third connection and not to the second connection.

9. The method according to claim 7, wherein the first and second switches are relays.

10. The method according to claim 7, wherein the first and second switches are transistors.

* * * * *